(12) United States Patent
Chao et al.

(10) Patent No.: US 8,902,599 B2
(45) Date of Patent: Dec. 2, 2014

(54) EXTERNAL STRUCTURE OF OUTDOOR ELECTRONIC APPARATUS

(75) Inventors: Po-Heng Chao, Taoyuan Hsien (TW); Jui-Ching Lee, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 209 days.

(21) Appl. No.: 13/551,589

(22) Filed: Jul. 17, 2012

(65) Prior Publication Data
US 2013/0258616 A1 Oct. 3, 2013

(30) Foreign Application Priority Data
Mar. 28, 2012 (TW) ............... 101110668 A (51) Int. Cl.
*H05K 5/06* (2006.01)
(52) U.S. Cl.
USPC ........... 361/752; 361/736; 361/641; 361/719; 361/669; 174/481; 174/520; 174/77 R; 174/142; 174/50.5
(58) Field of Classification Search
CPC ...................................... H05K 5/06
USPC .......... 361/752, 736, 641, 719; 174/481, 520, 174/142, 77 R
See application file for complete search history.

(56) References Cited

U.S. PATENT DOCUMENTS

| 6,618,271 | B1 * | 9/2003 | Erickson et al. | 361/818 |
| 6,945,795 | B1 * | 9/2005 | Gross, III et al. | 439/92 |
| 8,289,385 | B2 * | 10/2012 | Olsson et al. | 348/82 |

FOREIGN PATENT DOCUMENTS

CN         200980037 Y  * 11/2007

* cited by examiner

*Primary Examiner* — Jayprakash N Gandh
*Assistant Examiner* — Mandeep Buttar
(74) *Attorney, Agent, or Firm* — CKC & Partners Co., Ltd.

(57) ABSTRACT

An external structure of an outdoor electronic apparatus for packaging a circuit board having a power line is provided. The external structure includes a housing having an opening and a waterproof gasket. The waterproof gasket includes a main body, a platform portion, a first protrusion, and a bushing portion. The main body covers the opening. The platform portion, located at the inner side of the main body, extends into the housing from the opening. The platform portion seals the opening and tightly fits with the housing. The first protrusion is located on the platform portion for abutting against the circuit board. The bushing portion, located at the outer side of the main body, has a channel. The channel passes through the main body and the platform portion and can be passed through by the power line. The bushing portion and the power line tightly fit to each other.

10 Claims, 5 Drawing Sheets

Fig. 3 ial Field
EXTERNAL STRUCTURE OF OUTDOOR ELECTRONIC APPARATUS

RELATED APPLICATIONS

This application claims priority to Taiwan Application Serial Number 101110668, filed Mar. 28, 2012, which is herein incorporated by reference.

BACKGROUND

1. Technical Field

The present disclosure relates to an external structure of an outdoor electronic apparatus, and more particularly, to an external structure having functions of waterproof and dustproof.

2. Description of Related Art

In case of a lighting apparatus installed outdoors, it is essential of providing efficient water and dust-proof methods for the lighting apparatus. The outdoor lighting apparatus may encounter bad weathers, such as heavy thunderstorms or snowy, which may all damage the lighting apparatus. A heavy thunderstorm has such a huge momentum, speed, and rainfall amount that its rainwater may flow into a lighting apparatus using solid-state light sources with poor waterproof designs, which results in short circuit of the power supply of the lighting apparatus and malfunction of the lighting apparatus. Therefore, a design of waterproof structure is essential for the installation of the outdoor lighting apparatus.

Recently, in order to prevent the outdoor lighting apparatus from the influence of moisture, various external structures providing waterproof and dustproof functions for power supplies have been developed. A known external structure for a power supply includes a housing, a waterproof gasket, a metal end cover, a wire bushing (or a waterproof connector for wires), and screws that are independent from each other. Main electronic components (e.g., a circuit board) of the power supply are disposed in the housing. The waterproof gasket covers an opening of the housing. The metal end cover abuts against the waterproof gasket toward the opening of the housing, and the screws fix the metal end cover, the waterproof gasket, and the housing to each other, so that the housing can achieve the waterproof purpose. Furthermore, a power line of the power supply connecting the main electronic components subsequently passes through the waterproof gasket, the metal end cover, and the wire bushing and extends out of the housing. That is, the sealing capability between the wire bushing and the metal end cover play the decisive role to the performance of waterproof and dustproof of the external structure.

However, the aforementioned external structure for the power supply has following defects: (1) when the waterproof gasket is assembled to the housing, the waterproof gasket is unable to be efficiently positioned and easy to be damaged; (2) the wire bushing and the metal end cover are difficult to close together due to tolerance; (3) although having good sealing performance, the wire bushing is too expensive so as to reduce the price competitiveness of the overall product; (4) the volume of the waterproof connector for wires is too large, so it is difficult to be used in products having a plurality of outputting power lines; and (5) the respective components are independent with other, such that the entire structure is complicated and difficult to be assembled.

SUMMARY

In order to solve the problems of the prior art, the disclosure provides an improved external structure of an outdoor electronic apparatus, in which a waterproof gasket and a wire bushing can be integrally formed, and the wire bushing and a wire-cladding member of a power line form an interference fit, so as to entirely prevent the problem that moisture penetrates into the external structure via the gap between the wire bushing and a metal end cover. Moreover, the inner side of the waterproof gasket includes a platform portion capable of entirely filling and sealing an opening of a housing of the external structure by forming an interference fit with the opening. Meanwhile, the waterproof gasket can be positioned relative to the housing due to the interference fit formed between the platform portion and the opening. In order to fix a circuit board in the housing, the inner side of the waterproof gasket further includes a first protrusion, so as to eliminating the need for additionally disposing complicated positioning members in the housing. In addition, the outer side of the waterproof gasket includes a flange corresponding to a bending edge of the metal end cover, so as to solve the problem that the metal end cover cannot abut against the waterproof gasket to tightly press the opening of the housing due to the bending edge. Furthermore, an edge of the inner side of the waterproof gasket includes a second protrusion extended from the platform portion for acting as a foolproof design during assembling and press a grounding screw to prevent the grounding screw from loosing because of vibration. Because the components of the external structure of the disclosure are simple, the assembly working hours and costs can be greatly reduced.

According to an embodiment of the disclosure, an external structure of an outdoor electronic apparatus is used to package a circuit board. The circuit board has at least one power line. The external structure includes a housing and a waterproof gasket. The housing has an opening. The circuit board is located in the housing. The waterproof gasket includes a main body, a platform portion, a first protrusion, and a bushing portion. The main body covers the opening. The platform portion is located at the inner side of the main body and extends into the housing from the opening. The periphery of the platform portion seals the opening and tightly fits with the inner wall of the housing. The first protrusion is located on the platform portion for abutting against the circuit board. The bushing portion is located at the outer side of the main body and has a channel. The channel passes through the main body and the platform portion. The power line passes through the channel. The bushing portion and the power line tightly fit to each other.

In an embodiment of the disclosure, the housing has a circular end surface at the opening, and the main body entirely covers the circular end surface.

In an embodiment of the disclosure, the external structure further includes a metal end cover. The metal end cover includes a covering body and a fixing portion. The covering body abuts against the outer side of the main body and is fixed to the housing. The fixing portion is located at an edge of the covering body. The main body includes a flange. A bending edge is formed between the covering body and the fixing portion. The bending edge is aligned with the flange and abuts against the flange. The flange is located between the bending edge and a portion of the circular end surface.

In an embodiment of the disclosure, the bending edge has a first radius. The flange has a second radius. The first radius is smaller than the second radius.

In an embodiment of the disclosure, the metal end cover and the housing are fixed to each other by fastening at least one fastener to the circular end surface through the covering body and the main body.

In an embodiment of the disclosure, the metal end cover further includes a through hole for the bushing portion to pass through.

In an embodiment of the disclosure, the housing has a grounding screw hole adjacent to the opening. The grounding screw hole is for a grounding screw to fasten into. The waterproof gasket further includes a second protrusion. The second protrusion is located at the inner side of the main body and connected to an edge of the platform portion for abutting against and covering the grounding screw. The second protrusion is extended from the platform portion for acting as a foolproof design during assembling.

In an embodiment of the disclosure, the grounding screw hole is depressed from the inner wall of the housing.

In an embodiment of the disclosure, the external structure further includes another waterproof gasket. The waterproof gasket includes another main body, another platform portion, and another first protrusion. The another main body covers another opening of the housing. The another platform portion is located at the inner side of the another main body and extends into the housing from the another opening. The periphery of the another platform portion seals and tightly fits with the inner wall of the housing. The another first protrusion is located on the another platform portion. The circuit board is clamped between the first protrusion and the another protrusion.

In an embodiment of the disclosure, the external structure further includes a wire-cladding member. The wire-cladding member passes through the channel and is integrally formed with the waterproof gasket for cladding the power line.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

An improved external structure of an outdoor electronic apparatus is provided. Specifically, a waterproof gasket and a wire bushing can be integrally formed, and the wire bushing and a wire-cladding member of a power line form an interference fit, so as to entirely prevent the problem that moisture penetrates into the external structure via the gap between the wire bushing and a metal end cover. Moreover, the inner side of the waterproof gasket includes a platform portion capable of entirely filling and sealing an opening of a housing of the external structure by forming an interference fit with the opening. Meanwhile, the waterproof gasket can be positioned relative to the housing due to the interference fit formed between the platform portion and the opening. In order to fix a circuit board in the housing, the inner side of the waterproof gasket further includes a first protrusion, so as to eliminating the need for additionally disposing complicated positioning members in the housing. In addition, the outer side of the waterproof gasket includes a flange corresponding to a bending edge of the metal end cover, so as to solve the problem that the metal end cover cannot abut against the waterproof gasket to tightly press the opening of the housing due to the bending edge. Furthermore, an edge of the inner side of the waterproof gasket includes a second protrusion extended from the platform portion for acting as a foolproof design during assembling and press a grounding screw to prevent the grounding screw from loosing because of vibration.

Figure 1A:
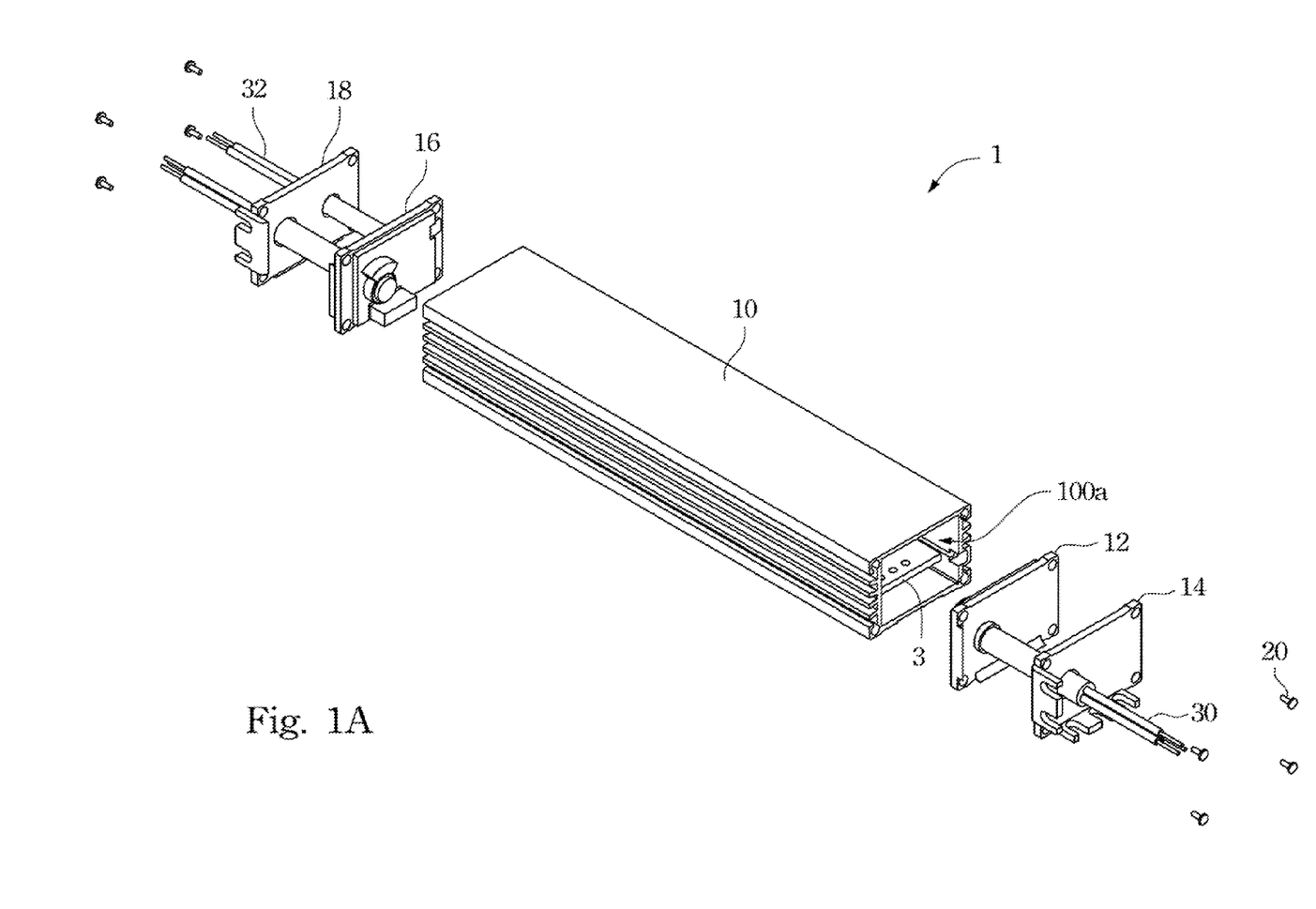
FIG. 1A is a perspective exploded view of an external structure of an outdoor electronic apparatus according to an embodiment of the disclosure.
Figure 1B:
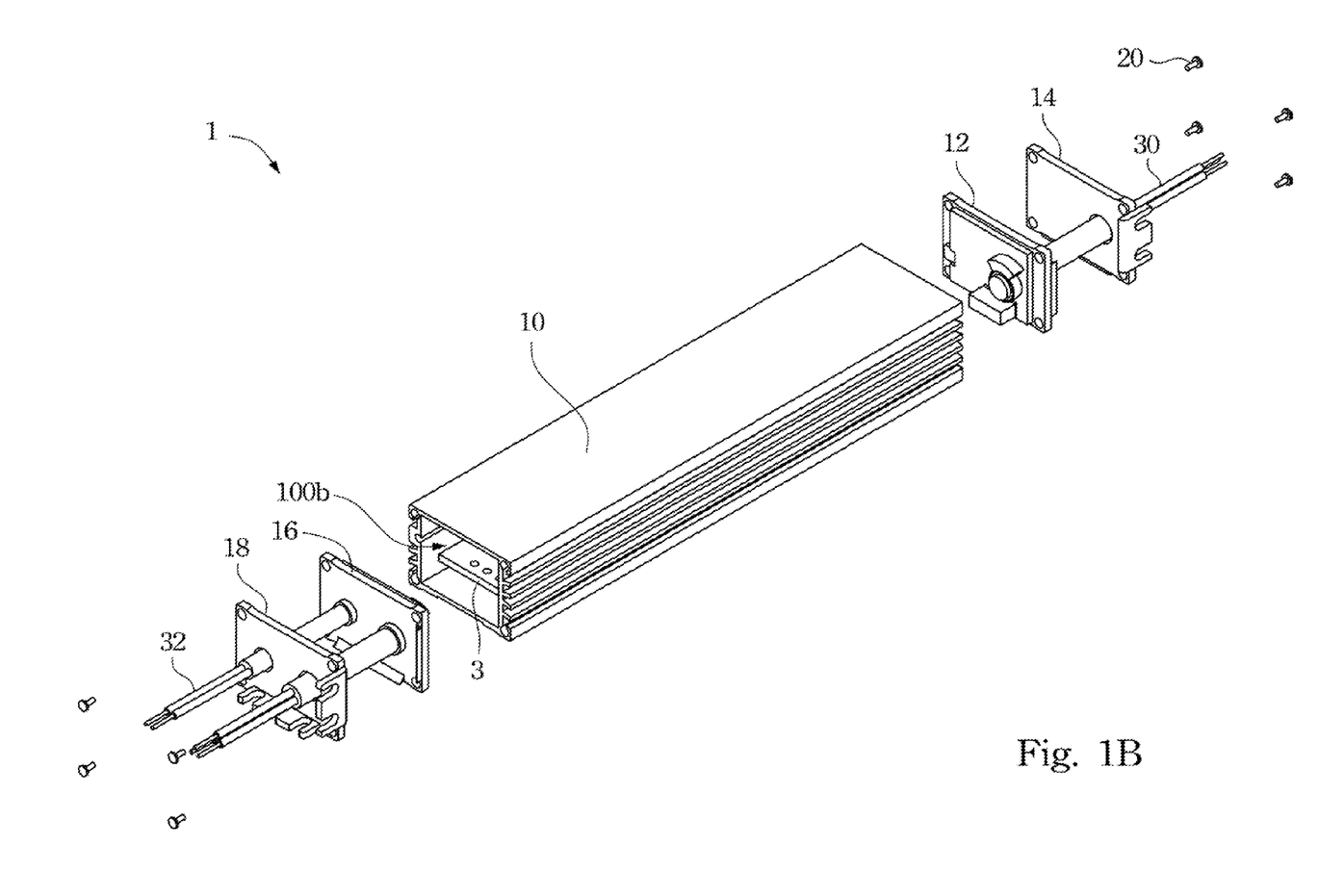
FIG. 1B is another perspective exploded view of the external structure in FIG. 1A.

FIG. 1A is a perspective exploded view of an external structure 1 of an outdoor electronic apparatus according to an embodiment of the disclosure. FIG. 1B is another perspective exploded view of the external structure 1 in FIG. 1A.

As shown in FIG. 1A and FIG. 1B, the external structure 1 of the disclosure can be used in power supplies of outdoor solid-state lighting apparatuses, but the disclosure is not limited thereto. That is, the external structure 1 of the disclosure can be used in any electronic product that requires waterproof function.

As shown in FIG. 1A and FIG. 1B, the external structure 1 is used to package a circuit board 3. The circuit board 3 has an inputting power line 30 and an outputting power line 32. The external structure 1 includes a housing 10, a waterproof gasket 12, and a metal end cover 14. Two ends of the housing 10 of the external structure 1 respectively have an opening 100a and another opening 100b. The circuit board 3 is located in the housing 10 (put in the housing 10 from the opening 100a or the another opening 100b.) Components of the external structure 1 and their structural configurations are described in detail below.

Figure 2A:
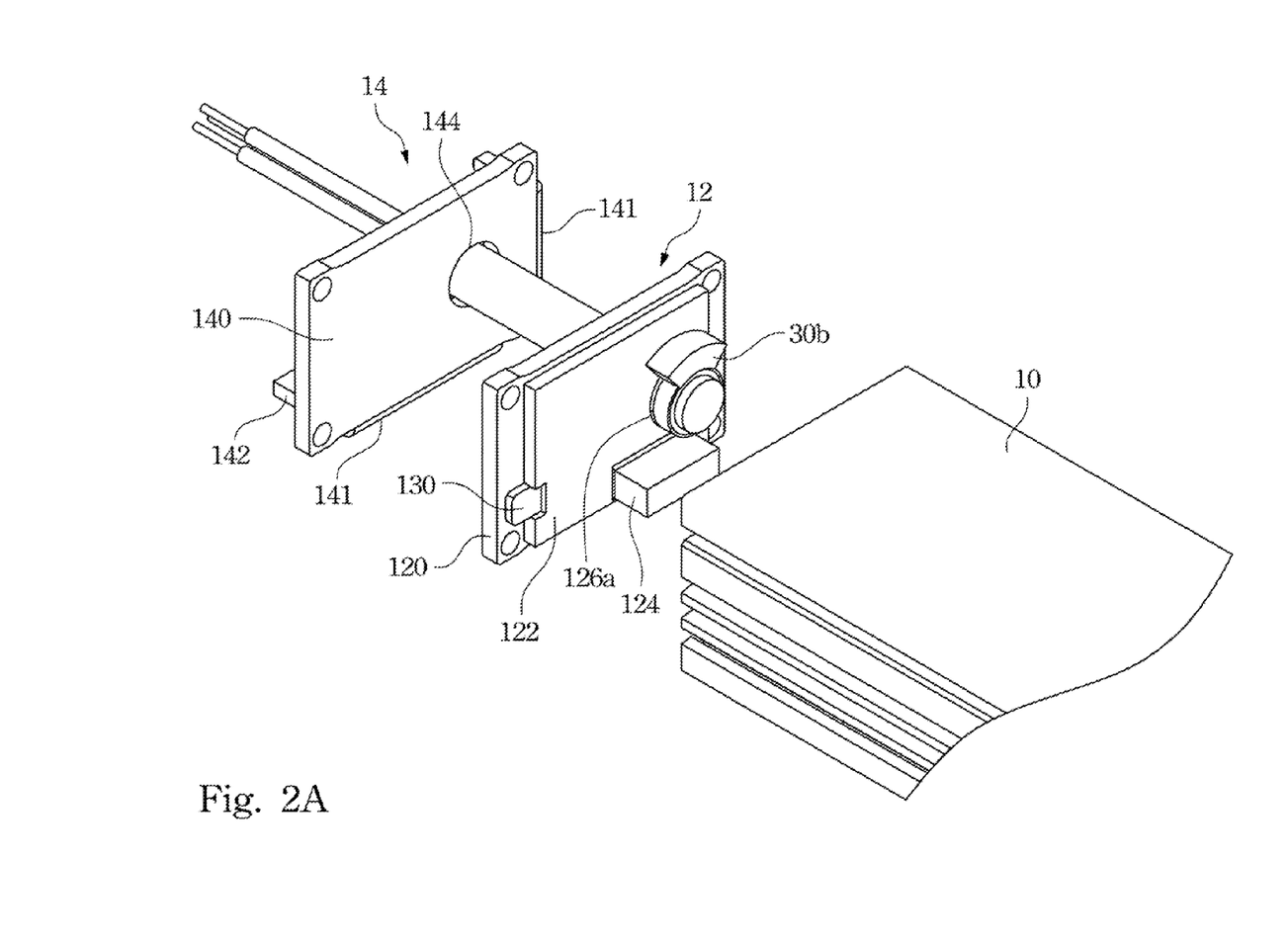
FIG. 2A is a partial enlarged view of the external structure in FIG. 1A.
Figure 2B:
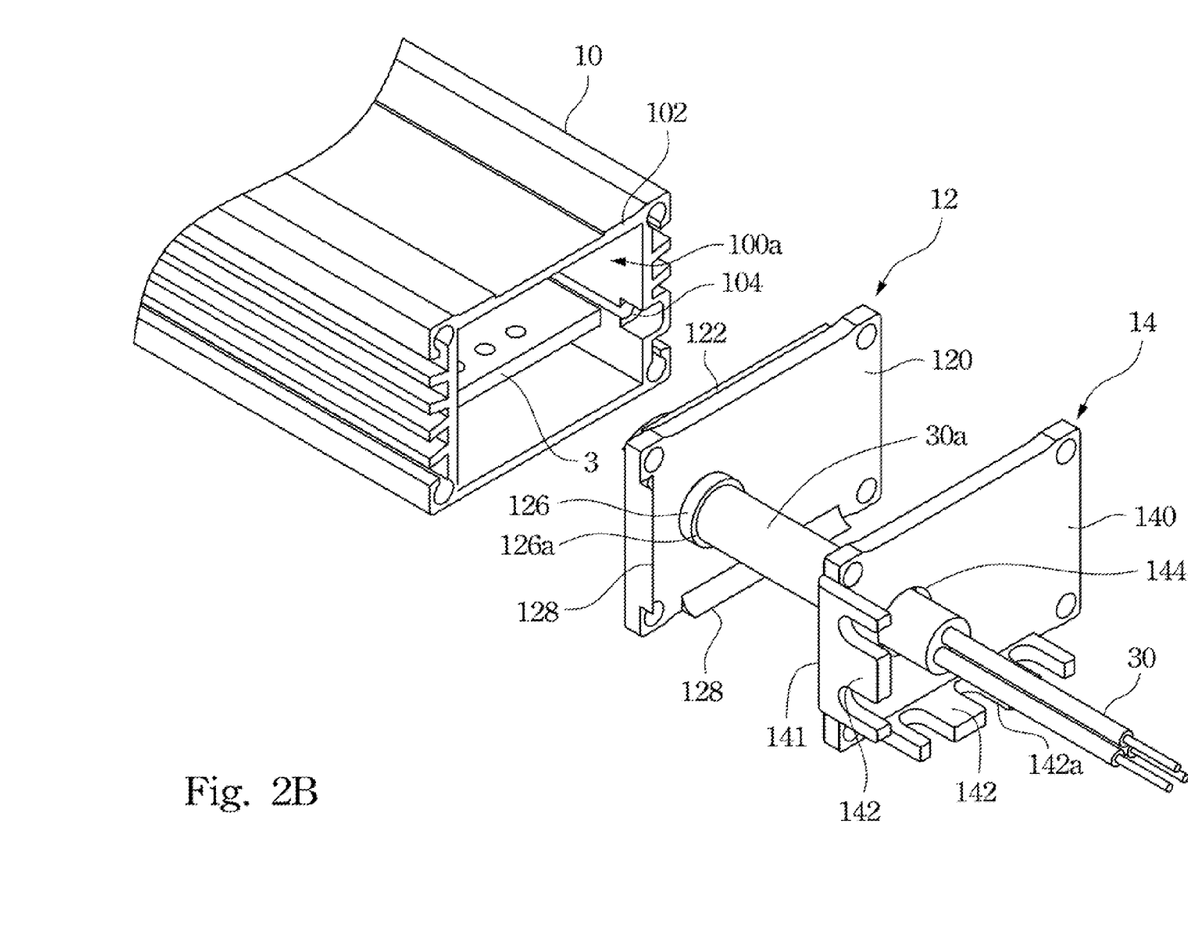
FIG. 2B is another partial enlarged view of the external structure in FIG. 1A.

FIG. 2A is a partial enlarged view of the external structure 1 in FIG. 1A. FIG. 2B is another partial enlarged view of the external structure 1 in FIG. 1A.

As shown in FIG. 2A and FIG. 2B, the waterproof gasket 12 of the external structure 1 includes a main body 120, a platform portion 122, a first protrusion 124, and a bushing portion 126. The main body 120 of the waterproof gasket 12 covers the opening 100a. Furthermore, the housing 10 has a circular end surface 102 at the opening 100a. The main body 120 of the waterproof gasket 12 entirely covers the circular end surface 102 of the housing 10, so as to entirely prevent the problem that liquid penetrates into the housing 10 via the gap between the main body 120 of the waterproof gasket 12 and the circular end surface 102 of the housing 10. The platform portion 122 of the waterproof gasket 12 is located at the inner side of the main body 120 (i.e., the right side of the main body 120 in FIG. 2A) and extends into the housing 10 from the opening 100a. The periphery of the platform portion 122 of the waterproof gasket 12 seals the opening 100a of the housing 10 and tightly fits with the inner wall of the housing 10 that is adjacent to the opening 100a. In other words, the platform portion 122 of the waterproof gasket 12 entirely fills and seals the opening 100a of the housing 10 by forming an interference fit with the opening 100a, and the waterproof gasket 12 can be positioned relative to the housing 10 due to the interference fit, so that the capability of waterproof of the external structure 1 can be greatly improved.

In addition, the first protrusion 124 of the waterproof gasket 12 is located on the platform portion 122 for abutting against the circuit board 3. The bushing portion 126 of the waterproof gasket 12 is located at the outer side of the main body 120 (i.e., the bushing portion 126 and the platform 122 or the first protrusion 124 are respectively located at different sides of the main body 120) and has a channel 126a. The channel 126a of the bushing portion 126 passes through the main body 120 and the platform portion 122, and the inputting power line 30 of the circuit hoard 3 passes through the channel 126a. The inputting power line 30 is clad by a wire-cladding member 30a. The bushing portion 126 of the waterproof gasket 12 and the wire-cladding member 30a of the inputting power line 30 form an interference fit. Furthermore, in order to prevent the inputting power line 30 from separating from the waterproof gasket 12, a wire tie 30b can be used to tie the wire-cladding member 30a of the inputting power line 30 at the inner side of the waterproof gasket 12.

That is, the main body 120 and the bushing portion 126 of the waterproof gasket 12 that are integrally formed not only can simplify the components of the external structure of the disclosure, but also solve the problem that liquid penetrates into the housing 10 via the gap between the bushing portion 126 of the waterproof gasket 12 and the metal end cover 14. In addition, compared with a known waterproof connector for wires, the volume of the bushing portion 126 of the disclosure is smaller, so the waterproof gasket 12 is advantageous in designs having a plurality of outputting power lines.

As shown in FIG. 2B, the metal end cover 14 of the external structure 1 includes a covering body 140 and a fixing portion 142. The covering body 140 of the metal end cover 14 abuts against the outer side of the main body 120 of the waterproof gasket 12 and is fixed to the circular end surface 102 of the housing 10. In the embodiment, the metal end cover 14 and the housing 10 are fixed to each other by fastening fasteners 20 to the circular end surface 102 of the housing 10 subsequently through the covering body 140 and the main body 120 of the waterproof gasket 12, as shown in FIG. 1A and FIG. 1B. The fixing portion 142 of the metal end cover 14 is located at the outer side of the covering body 140, adjacent to an edge of the covering body 140, and bent relative to the covering body 140. Because the external structure 1 of the disclosure is installed outdoors, the external structure 1 can be fixed to outdoor venues (e.g., walls of buildings, utility poles, etc.) by fastening the fastening portions 142a of the fixing portion 142 to the outdoor venues using screws (not shown), so that the outdoor electronic apparatus can steady operate outdoor.

Furthermore, because the fixing portion 142 of the metal end cover 14 is bent relative to the covering body 140, a bending edge 141 is formed between the covering body 140 and the fixing portion 142. In an embodiment, the metal end cover 14 of the disclosure can be manufactured by a stamping process or a die casting process. In order to save costs, the metal end cover 14 can be manufactured by the stamping process, but the process makes the bending edge 141 between the covering body 140 and the fixing portion 142 have a first radius (i.e., a curved corner formed by bent.) In addition, owing to limitations of product specifications, the edge of the metal end cover 14 must be aligned with the periphery of the circular end surface 102 of the housing 10. However, the curved corner of the bending edge 141 may result in that the edge of the covering body 140 of the metal end cover 14 is difficulty to abut against the main body 120 of the waterproof gasket 12 to tightly press the circular end surface 102 of the housing 10, so that the problem that liquid penetrates into the housing 10 via the gap between the main body 120 of the waterproof gasket 12 and the circular end surface 102 is easily occurred.

Therefore, the outer side of the main body 120 of the waterproof gasket 12 further includes a flange 128. The flange 128 of the waterproof gasket 12 is disposed corresponding to the bending edge 141 of the metal end cover 14. That is, the bending edge 141 of the metal end cover 14 can abut against and be aligned with the flange 128 of the waterproof gasket 12, and the flange 128 is located between the bending edge 141 and a portion of the circular end surface 102. In an embodiment, the flange 128 of the waterproof gasket 12 has a second radius. The disclosure makes the first radius of the bending edge 141 smaller than the second radius of the flange 128 (i.e., the edge of the covering body 140 and the flange 128 of the waterproof gasket 12 form an interference fit under the configuration that the covering body 140 of the metal end cover 14 and the circular end surface 102 of the housing 10 have been fixed to each other), so as to effectively compensate the problem that the main body 120 of the waterproof gasket 12 cannot tightly press the circular end surface 102 of the housing 10.

As shown in FIG. 2A and FIG. 2B, the metal end cover 14 has a through hole 144. The bushing portion 126 of the waterproof gasket 12 can pass through the through hole 144 of the metal end cover 14. In the known external structure, the metal end cover and the wire bushing (or the waterproof connector for wires) are independent components, so the sealing performance between the metal end cover and the wire bushing must be strictly ensured. However, because the main body 120 and the bushing portion 126 of the waterproof gasket 12 are integrally formed, an interference fit is unnecessary to be formed between the bushing portion 126 of the waterproof gasket 12 and the metal end cover 14, as long as the size of the through hole 144 of the metal end cover 14 is suitable to allow the bushing portion 126 of the waterproof gasket 12 to pass through.

As shown in FIG. 2A and FIG. 2B, the housing 10 of the external structure 1 has a grounding screw hole 104 adjacent to the opening 100a. The grounding screw hole 104 is for a grounding screw (not shown) to fasten into. Therefore, an end of a grounding line (not shown) extended from the circuit board 3 can be fastened between the grounding screw and the inner wall of the housing 10. The waterproof gasket 12 of the external structure 1 further includes a second protrusion 130. The second protrusion 130 of the waterproof gasket 12 is located at the inner side of the main body 120 and connected to an edge of the platform portion 122 for abutting against and covering the grounding screw. The second protrusion 130 of the waterproof gasket 12 can achieve the purpose of preventing the grounding screw from loosing because of vibration.

Furthermore, the grounding screw hole 104 of the housing 10 is depressed from the inner wall of the housing 10, as shown in FIG. 2B. The second protrusion 130 of the waterproof gasket 12 correspondingly extends from platform portion 122 toward the inner wall of the housing 10. The second protrusion 130 of the waterproof gasket 12 that is extended from the platform portion 122 acts as a foolproof design during assembling, so that assembling errors and working hours can be greatly reduced.

Figure 3:
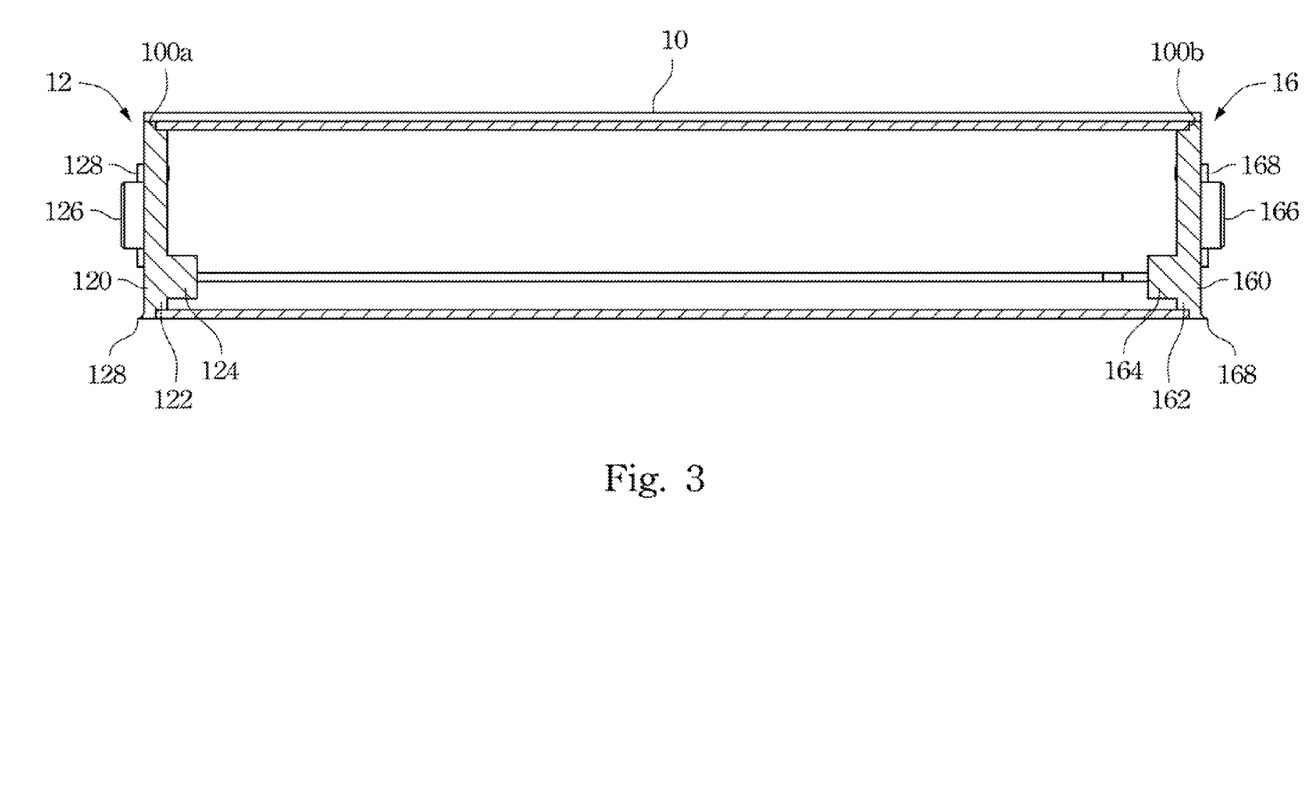
FIG. 3 is a sectional view of the waterproof gasket and the housing that have been assembled to each other.

FIG. 3 is a sectional view of the waterproof gasket and the housing that have been assembled to each other.

As shown in FIG. 1A, FIG. 1B, and FIG. 3, the external structure 1 further includes another waterproof gasket 16 and another metal end cover 18. The another waterproof gasket 16 further includes another main body 160, another platform portion 162, another first protrusion 164, another bushing portion 166, and another flange 168. The another main body 160 of the another waterproof gasket 16 covers the another opening 100b of the housing 10. The another platform portion 162 of the another waterproof gasket 16 is located at the inner side of the another main body 160 and extends into the housing 10 from the another opening 100b. The periphery of the another platform portion 162 of the another waterproof gasket 16 seals and tightly fits with the inner wall of the housing 10 that is adjacent to the another opening 100b. The another first protrusion 164 of the another waterproof gasket 16 is located on the another platform portion 162. The relationships among the housing 10, the another waterproof gasket 16, and the another metal end cover 18 can refer to the related descriptions about the housing 10, the waterproof gasket 12, and the metal end cover 14 and do not redundantly described here.

Particularly, the circuit board 3 in the housing 10 is clamped between the first protrusion 124 of the waterproof gasket 12 and the another protrusion 164 of the another waterproof gasket 16. That is, the external structure 1 can achieve the purpose of positioning the circuit board 3 in the housing 10 by clamping two ends of the circuit board 3 by the first protrusion 124 of the waterproof gasket 12 and the another protrusion 164 of the another waterproof gasket 16 that respectively extends into the opening 100a and the another opening 100b of the housing 10. Compared with the known external structure that needs to additionally disposing complicated positioning members in the housing to position the circuit board, the structures of the waterproof gasket 12 and the another waterproof gasket 16 of the disclosure are simple and easy to be manufactured, so the additional values of the waterproof gasket 12 and the another waterproof gasket 16 can be increased.

In an embodiment, the wire-cladding member 30a that clothes the inputting power line 30 of the circuit board 3 can also be integrally formed with the waterproof gasket 12, so that the wire tie 30b can be eliminated.

According to the foregoing recitations of the embodiments of the disclosure, it can be seen that an improved external structure of an outdoor electronic apparatus make a waterproof gasket and a wire bushing be integrally formed, and the wire bushing and a wire-cladding member of a power line form an interference fit, so as to entirely prevent the problem that moisture penetrates into the external structure via the gap between the wire bushing and a metal end cover. Moreover, the inner side of the waterproof gasket includes a platform portion capable of entirely filling and sealing an opening of a housing of the external structure by forming an interference fit with the opening. Meanwhile, the waterproof gasket can be positioned relative to the housing due to the interference fit formed between the platform portion and the opening. In order to fix a circuit board in the housing, the inner side of the waterproof gasket further includes a first protrusion, so as to eliminating the need for additionally disposing complicated positioning members in the housing. In addition, the outer side of the waterproof gasket includes a flange corresponding to a bending edge of the metal end cover, so as to solve the problem that the metal end cover cannot abut against the waterproof gasket to tightly press the opening of the housing due to the bending edge. Furthermore, an edge of the inner side of the waterproof gasket includes a second protrusion extended from the platform portion for acting as a foolproof design during assembling and press a grounding screw to prevent the grounding screw from loosing because of vibration. Because the components of the external structure of the disclosure are simple, the assembly working hours and costs can be greatly reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An external structure of an outdoor electronic apparatus for packaging a circuit board, the circuit board having at least one power line, the external structure comprising:
    a housing having an opening, wherein the circuit board is located in the housing; and
    a waterproof gasket comprising:
        a main body covering the opening:
        a platform portion located at the inner side of the main body and extending into the housing from the opening, wherein the periphery of the platform portion seals the opening and tightly fits with the inner wall of the housing;
        a first protrusion located on the platform portion for abutting against the circuit board; and
        a bushing portion located at the outer side of the main body and having a channel, the channel passing through the main body and the platform portion and the power line passing through the channel, wherein the bushing portion and the power line tightly fit to each other.

2. The external structure of claim 1, wherein the housing has a circular end surface at the opening, and the main body entirely covers the circular end surface.

3. The external structure of claim 2, further comprising a metal end cover, and the metal end cover comprising:
    a covering body abutting against the outer side of the main body and fixed to the housing; and
    a fixing portion located at an edge of the covering body, wherein a bending edge is formed between the covering body and the fixing portion,
    wherein the main body comprises a flange, the bending edge is aligned with the flange and abuts against the flange, and the flange is located between the bending edge and a portion of the circular end surface.

4. The external structure of claim 3, wherein the bending edge has a first radius, the flange has a second radius, and the first radius is smaller than the second radius.

5. The external structure of claim 3, wherein the metal end cover and the housing are fixed to each other by fastening at least one fastener to the circular end surface through the covering body and the main body.

6. The external structure of claim 3, wherein the metal end cover farther comprises a through hole for the bushing portion to pass through.

7. The external structure of claim 1, wherein the housing has a grounding screw hole adjacent to the opening, the grounding screw hole is for a grounding screw to fasten into, and the waterproof gasket further comprises a second protrusion, located at the inner side of the main body and connected to an edge of the platform, for abutting against and covering the grounding screw.

8. The external structure of claim 7, wherein the grounding screw hole is depressed from the inner wall of the housing.

9. The external structure of claim 1, further comprising another waterproof gasket, and the waterproof gasket comprising;
    another main body covering another opening of the housing;

another platform portion located at the inner side of the another main body and extending into the housing from the another opening, wherein the periphery of the another platform portion seals and tightly fits with the inner wall of the housing; and another first protrusion located on the another platform portion, wherein the circuit board is clamped between the first protrusion and the another protrusion.

10. The external structure of claim 1, further comprising a wire-cladding member passing through the channel and integrally formed with the waterproof gasket for cladding the power line.

* * * * *